(12) United States Patent
Musoll et al.

(10) Patent No.: US 12,323,164 B1
(45) Date of Patent: *Jun. 3, 2025

(54) CAPACITY-EXPANDING MEMORY CONTROL COMPONENT

(71) Applicant: Astera Labs, Inc., Santa Clara, CA (US)

(72) Inventors: Enrique Musoll, San Jose, CA (US); Anh T. Tran, Elk Grove, CA (US); Subbarao Arumilli, Cupertino, CA (US); Chi Feng, San Jose, CA (US)

(73) Assignee: Astera Labs, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/228,106

(22) Filed: Jul. 31, 2023

Related U.S. Application Data

(63) Continuation of application No. 18/210,458, filed on Jun. 15, 2023, now Pat. No. 12,095,480, which is a continuation of application No. 17/534,327, filed on Nov. 23, 2021, now Pat. No. 11,722,152, application No. 18/228,106, filed on Jul. 31, 2023 is a
(Continued)

(51) Int. Cl.
| | |
|---|---|
| *H03M 13/15* | (2006.01) |
| *G11C 29/36* | (2006.01) |
| *G11C 29/42* | (2006.01) |
| *H03M 13/09* | (2006.01) |

(52) U.S. Cl.
CPC ........ *H03M 13/1575* (2013.01); *G11C 29/36* (2013.01); *G11C 29/42* (2013.01); *H03M 13/095* (2013.01); *H03M 13/1515* (2013.01); *G11C 2029/3602* (2013.01)

(58) Field of Classification Search
CPC . G11C 2029/3602; G11C 29/36; G11C 29/42; H03M 13/095; H03M 13/1515; H03M 13/1575
See application file for complete search history.

(56) References Cited

U.S. PATENT DOCUMENTS

| | | |
|---|---|---|
| 4,507,779 A | 3/1985 | Barner, Jr. et al. |
| 4,541,091 A | 9/1985 | Nishida et al. |

(Continued)

OTHER PUBLICATIONS

M. Patel, J. S. Kim, T. Shahroodi, H. Hassan and O. Mutlu, "Bit-Exact ECC Recovery (BEER): Determining DRAM On-Die ECC Functions by Exploiting DRAM Data Retention Characteristics," 2020 53rd Annual IEEE/ACM International Symposium on Microarchitecture (MICRO), Athens, Greece, 2020, pp. 282-297. (Year: 2020).*

(Continued)

*Primary Examiner* — Albert Decady
*Assistant Examiner* — Enamul M Kabir
(74) *Attorney, Agent, or Firm* — Charles Shemwell

(57) ABSTRACT

A memory control component encodes over-capacity data into an error correction code generated for and stored in association with an application data block, inferentially recovering the over-capacity data during application data block read-back by comparing error syndromes generated in detection/correction operations for respective combinations of each possible value of the over-capacity data and the read-back application data block.

23 Claims, 2 Drawing Sheets

Related U.S. Application Data continuation of application No. 17/534,327, filed on Nov. 23, 2021, now Pat. No. 11,722,152.

(60) Provisional application No. 63/118,595, filed on Nov. 25, 2020.

(56) References Cited

U.S. PATENT DOCUMENTS

| | | | |
|---|---|---|---|
| 4,541,092 | A | 9/1985 | Sako et al. |
| 4,607,367 | A | 8/1986 | Ive et al. |
| 5,010,554 | A | 4/1991 | Bechtel et al. |
| 5,051,998 | A | 9/1991 | Murai et al. |
| 5,430,739 | A | 7/1995 | Wei et al. |
| 5,483,236 | A | 1/1996 | Bi |
| 5,926,490 | A | 7/1999 | Reed et al. |
| 5,961,658 | A | 10/1999 | Reed et al. |
| 6,009,549 | A | 12/1999 | Bliss et al. |
| 6,332,206 | B1 | 12/2001 | Nakatsuji et al. |
| 8,694,862 | B2 | 4/2014 | Sazeides et al. |
| 9,569,308 | B1* | 2/2017 | Ware ................ H03M 13/6502 |
| 10,797,728 | B1* | 10/2020 | Varnica ............ H03M 13/3707 |
| 2001/0036236 | A1 | 11/2001 | Kobayashi et al. |
| 2002/0199153 | A1 | 12/2002 | Fall |
| 2003/0031236 | A1 | 2/2003 | Dahlman et al. |
| 2010/0299575 | A1* | 11/2010 | Roth ..................... G11C 7/1006 714/755 |
| 2012/0121084 | A1 | 5/2012 | Tomlinson et al. |
| 2012/0284589 | A1 | 11/2012 | Kim et al. |
| 2013/0246889 | A1* | 9/2013 | Kumar ................. G11C 29/42 714/763 |
| 2013/0318423 | A1* | 11/2013 | Jagmohan .......... G06F 11/1008 714/E11.032 |
| 2014/0047265 | A1 | 2/2014 | Das et al. |
| 2014/0068390 | A1* | 3/2014 | Schmidberger ..... H03M 13/152 714/782 |
| 2014/0136931 | A1 | 5/2014 | Nakamura et al. |
| 2015/0256197 | A1* | 9/2015 | Kim ........................ G06F 11/10 714/768 |
| 2016/0006459 | A1 | 1/2016 | Hanham et al. |
| 2016/0092307 | A1 | 3/2016 | Bonen et al. |
| 2016/0336971 | A1 | 11/2016 | Fong et al. |
| 2016/0365876 | A1* | 12/2016 | Greenspan .......... H03M 13/451 |
| 2017/0063394 | A1* | 3/2017 | Halbert ................. G06F 3/0619 |
| 2017/0255394 | A1 | 9/2017 | Suh et al. |
| 2017/0093528 | A1 | 11/2017 | Oveis et al. |
| 2018/0060160 | A1* | 3/2018 | Fang ................. H03M 13/1525 |
| 2020/0097359 | A1* | 3/2020 | O'Connor ............ G11C 11/406 |
| 2020/0401475 | A1 | 12/2020 | Lu |
| 2021/0208967 | A1* | 7/2021 | Cha ........................ H03M 13/13 |
| 2022/0013187 | A1 | 1/2022 | Santhanam |
| 2022/0091936 | A1* | 3/2022 | La Fetra ............. G06F 11/1076 |
| 2024/0380415 | A1 | 11/2024 | Dakshinamoorthy et al. |

OTHER PUBLICATIONS

M. Rakús, p. Farkaš, T. Pálenÿk and A. Daniš, "Five Times Extended Reed-Solomon Codes Applicable in Memory Storage Systems," in IEEE Letters of the Computer Society, vol. 2, No. 2, pp. 9-11. (Year: 2019).*

United States Patent and Trademark Office, Non-Final Office Action in U.S. Appl. No. 17/888,264, dated Dec. 22, 2023, 52 pages.

Intel Corporation, "Intel Xeon Processor E5-1600/2400/2600/4600 v3 Product Families Datasheet—vol. 2: Registers," Jun. 2015, 414 pages.

Molka et al., "Cache Coherence Protocol and Memory Performance of the Intel Haswell—EP Architecture," IEEE 2015, 10 pages.

* cited by examiner

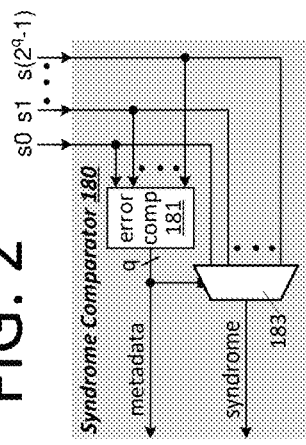

FIG. 2

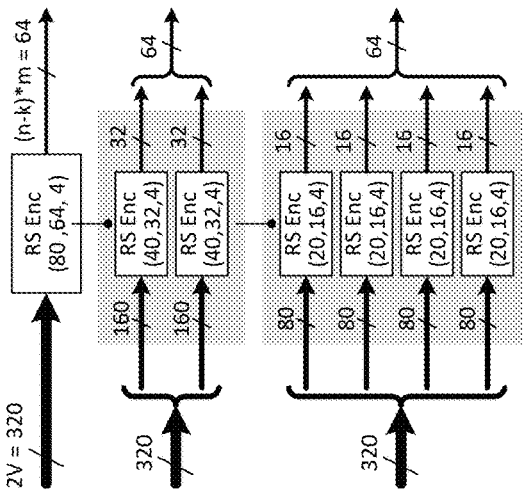

FIG. 6

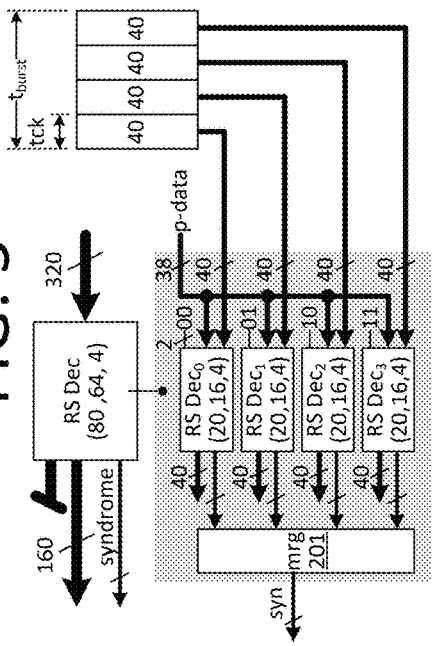

FIG. 5

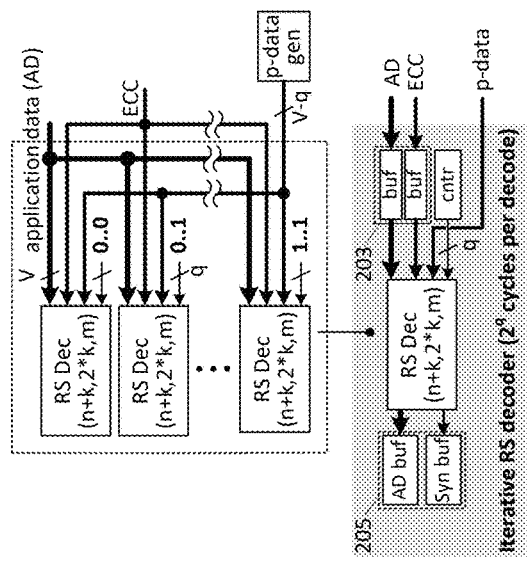

| # Bad Symbols | Syndrome Status | Syndrome Comparator Action |
|---|---|---|
| 0 | one syndrome reports 0 bad symbols<br>other syndromes each report 1 bad symbol | output syndrome reporting fewest bad symbols and encode metadata accordingly (data good, metadata good) |
| 1 to (n-k)/2 | one syndrome reports 1 to (n-k)/2 bad symbols<br>other syndromes each report 2 to ((n-k)/2)+1 bad symbols | output syndrome reporting fewest bad symbols and encode metadata accordingly (data good, metadata good) |
| 1+(n-k)/2 to n-k-1 | one syndrome reports 1 to (n-k)/2 bad symbols<br>other syndromes each report 2 to 1+(n-k)/2 bad symbols | output syndrome reporting fewest bad symbols and encode metadata accordingly (data bad, metadata good) |
| n-k | one syndrome reports n-k bad symbols<br>other syndromes each report bogus value | output syndrome reporting n-k bad symbols and encode metadata according to that syndrome |
| >n-k | all syndromes report bogus values | output bogus-valued syndrome with default/don't-care metadata-encoding (data bad, metadata bad) |

CAPACITY-EXPANDING MEMORY CONTROL COMPONENT

CROSS REFERENCE TO RELATED APPLICATIONS

This application is a continuation of U.S. application Ser. No. 18/210,458 filed Jun. 15, 2023, which is a continuation of U.S. application Ser. No. 17/534,327 filed Nov. 23, 2021, which claims the benefit of U.S. provisional application No. 63/118,595 filed Nov. 25, 2020. This application is also a continuation of U.S. application Ser. No. 17/534,327 filed Nov. 23, 2021. Each of the above-identified applications is hereby incorporated by reference.

DRAWINGS

The various embodiments disclosed herein are illustrated by way of example, and not by way of limitation, in the figures of the accompanying drawings and in which like reference numerals refer to similar elements and in which:

FIG. 2 illustrates an exemplary syndrome comparator embodiment that may be used to implement the syndrome comparator shown in FIG. 1;

Figure 1:
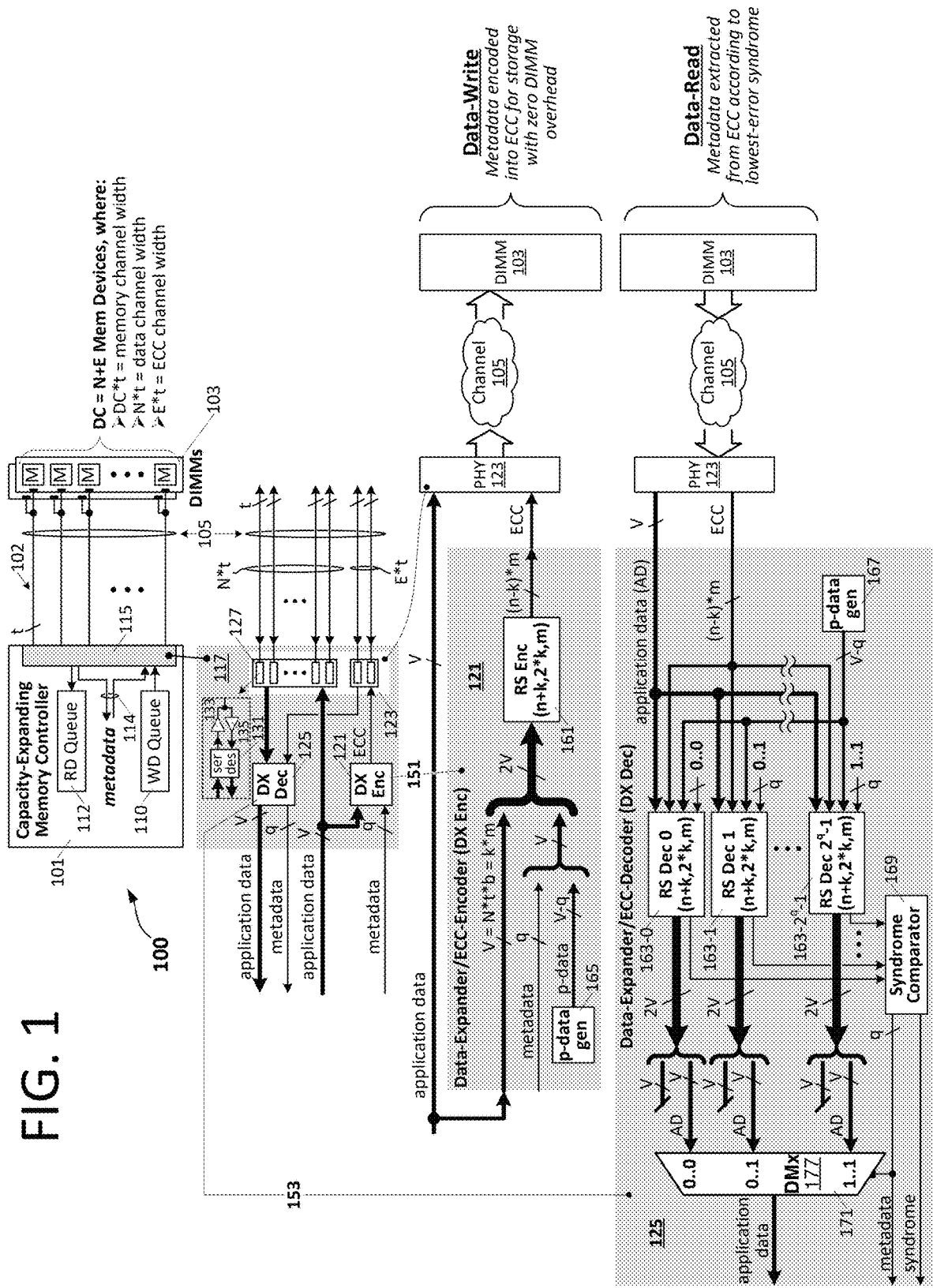
FIG. 1 illustrates an embodiment of a memory system having a capacity-expanding memory control component coupled to one or more dual inline memory modules (DIMMs)

FIG. 3 presents an exemplary listing/tabulation of actions implemented by the FIG. 2 syndrome comparator for various syndrome status conditions and corresponding bad-symbol counts in the case where metadata size is less than or equal to Reed-Solomon (RS) symbol size;

FIG. 4 illustrates an exemplary RS encoder implemented by two or more component RS encoders;

FIG. 5 illustrates an exemplary RS decoder likewise be implemented by two or more component RS decoders; and FIG. 6 illustrates exemplary application of a single RS decoder to iteratively execute multiple RS decode operations with respect to the same application data block.

DETAILED DESCRIPTION

In various embodiments herein a memory control component encodes over-capacity data into an error correction code (ECC) generated for and stored in association with an application data block, inferentially recovering the over-capacity data during application data block read-back by comparing error syndromes generated in detection/correction operations for respective combinations of each possible value of the over-capacity data and the read-back application data block. In a number of embodiments, application data blocks and corresponding data-encoded ECCs are stored within and read back from integrated-circuit memory devices disposed on a dual inline memory module (DIMM), with the ECC-encoded over-capacity data storage increasing the effective data storage capacity of the DIMM in accordance with the relative sizes (volumes, bit-counts) of the application data block and over-capacity data. In applications where the over-capacity data is generated by (and returned upon read-back to) one or more components or entities other than the application data requestor—as in the case of metadata storage required by various high-performance interconnect standards—ECC-encoded over-capacity storage of the metadata obviates both compromised application data storage capacity (e.g., where metadata storage would otherwise consume some portion of the application data storage capacity) and auxiliary hardware storage expense/overhead (i.e., no need for the costly and area-consuming additional memory that plagues conventional metadata storage solutions).

FIG. 1 illustrates an embodiment of a memory system 100 having a capacity-expanding memory control component 101 coupled via data links 102 to one or more DIMMs 103. In the depicted example, memory control component 101 ("controller") includes read and write data queues (110, 112) together with connections (114) to a "metadata" source/destination (which could be the read and write data queues themselves rather than an alternative entity) and an error detecting/correcting data-signaling interface 115, the latter to generate for each outgoing write data block (a volume of "application" data to be stored/written within constituent memory devices of a selected DIMM 103 in a memory write transaction) an error correction code to be stored in DIMM 103 with the write data block. During data read-back, both the application data (the write data block during the memory-write transaction and now, in a subsequent memory read transaction, a read data block) and the corresponding error correction code are output from DIMM 103 to controller 101, the latter (ECC) being applied within data signaling interface 115 to detect and if necessary/possible, correct, corrupted (bad) symbols within the retrieved application data block.

Referring to detail view 117 of signaling interface 115, the metadata and corresponding application data block are applied, during a data write transaction, to data-expander/ECC encoding circuitry 121 which responsively generates a data-dependent ECC—an error correction code that reflects both the application data block and the metadata—outputting the application data block and ECC to a selected DIMM via physical signaling interface 123 (PHY). During subsequent data read-back (i.e., in a memory read transaction), the retrieved-from-memory application data block and ECC (arriving via PHY 123) are applied, in combination with each possible metadata value, and thus $2^q$ bit values (or bit patterns) where the metadata is constituted by 'q' bits, to data-expander/ECC decoding circuitry 125 to yield $2^q$ error syndromes-a respective syndrome for each different possible metadata value. Assuming for sake of explanation that there are no bit errors in the read-back application data block or ECC, then whichever of the $2^q$ metadata values supplied to ECC decoder 125 matches the metadata value used to encode the ECC will yield a no-error syndrome (i.e., syndrome value indicating that no errors were detected), distinguishing that specific metadata value from all others (as the syndromes generated using the remaining $2^q-1$ metadata values will all indicate at least one error corresponding to the incorrect metadata value) and thus enabling the originally written metadata value to be recovered (or inferred, extracted) as part of the ECC decoding operation. As a more specific example, where ECC encoding/decoding is implemented as part of a block-based error correction/detection scheme that enables detection of errors with multi-bit symbol granularity (e.g., 4-bit symbol, 8-bit symbol, etc.), then the ECC decode operation applying the correct (original-matching) metadata value will produce one fewer symbol errors than all other (incorrect) metadata values—again, enabling recovery of the originally "written" metadata value. Because the size of the stored application data block and corresponding ECC exactly match the data block size and ECC size stored in a conventional memory system, the metadata is effectively stored (as part of the controller ECC encoding) and then retrieved (controller ECC decoding) with zero additional memory consumption within the DIMM. That is, the DIMM capacity available for application data storage (with such data including any type of user data, hardware-generated data, operating-system data, etc.) remains intact and uncompromised, and likewise with the storage space available for ECC-effectively expanding the capacity of the DIMM by a factor of (q+V)/V (where 'V' is the bit-size of the application data block) through additional ECC encoding and decoding.

In the FIG. 1 embodiment and a number of embodiments discussed below, data-expander/encoder 121 executes Reed-Solomon (RS) encoding (i.e., implements an RS encoder) to generate the metadata-dependent ECC during data write, and data-expander/decoder 125 executes $2^q$ RS decoding operations (within one or more RS decoders) during data read—one RS decoding operation for each of the $2^q$ possible metadata values—to both recover the ECC-encoded metadata bits and implement the primary ECC function (detecting/correcting symbol errors). To maintain a power-of-two message size (i.e., number (k) of m-bit symbols constituted by the data supplied to the RS encoder) despite the added metadata bits, the ECC encoders/decoders are enlarged/upgraded (relative to those needed for the application data block alone) to accommodate a message size twice that of the application data block (i.e., 2*V bits, where '*' denotes multiplication) and additional pattern data bits are combined with the metadata as necessary to produce the expanded, double-size data input. More specifically with regard to message size expansion, the V-bit application data block and q-bit metadata are supplemented by V−q (V minus q) bits of deterministic pattern data to form the expanded (2*V-bit) data input to the RS encoder during a data write transaction to a given memory address (yielding the ECC written with the application data block). Likewise, in a subsequent data read transaction directed to that same address, the retrieved application data block (V bits) is supplemented/expanded by the deterministic pattern data (i.e., regenerated within the controller as the pattern data has a predetermined or deterministically generable bit pattern) to form, together with each of the $2^q$ possible metadata values, $2^q$ messages each constituted by 2*V bits and differing only in the metadata value. While the FIG. 1 embodiment and those discussed below present a doubled expansion (i.e., from V to 2*V) of the message size (volume of data supplied to ECC encoder and then again to ECC decoder) relative to the application data block size (V), the message size may more generally be expanded, at least in an RS encoding/decoding scheme, by $2^i$*V, where i=1, 2, 3, . . . J, and J is any practicable value.

FIG. 1 illustrates the above-described data-expansion and encoder/decoder enlargement in detail views 151 and 153 (of data-expander/encoder 121 and data-expander/decoder 125, respectively) in the context of RS encoders/decoders parameterized by block size, message size and symbol size (i.e., "n, k, m" where 'm' is the size of a correctable symbol in bits, 'k' is the number of symbols per message (as described above), and 'n' is the total number of symbols per block such that n=k+w, where 'w' is the number of symbols per ECC and also the number of detectable corrupted/bad symbols). That is, RS encoder 161 within data-expander/encoder 121 is enlarged relative to a baseline RS (n, k, m) encoder to implement RS (n+k, 2*k, m) and ditto for each of the RS decoders (163-0 to 163-$2^q$−1) within data-expander/decoder 125—all enlarged from RS (n, k, m) to RS (n+k, 2*k, m).

Still referring to detail views 151 and 153, pattern data generators 165 and 167 are implemented within data-expander/encoder 121 and data-expander/decoder 125, respectively, to produce the pattern data bits ("p-data") merged with the metadata (or each of the possible metadata values within decoder 125) and application data block to yield the expanded (doubled) message size. In differing embodiments, the pattern generators may output either fixed pattern values (e.g., all '1's, all '0's, alternating '1' and '0' patterns or any other fixed/static bit pattern) or dynamic bit patterns. In the latter (dynamic pattern) case, for example, a pseudo-random number generator may be seeded by the memory address of the subject application data block and/or any other fiducial information available within the controller integrated circuit, with temporary storage of any ephemeral value (e.g., memory read address) as necessary to make that value available for pattern data re-generation at ECC decode time. Also, in the case of fixed/static pattern data at least, the same pattern data source (e.g., set of nodes coupled to ground and/or VDD) may supply pattern data to both the enlarged RS encoder and enlarged RS decoder (i.e., only one pattern data source need be implemented).

Referring specifically to detail view 153 of data expander/ECC decoder 125, each of the $2^q$ enlarged RS decoders (generically, 163) outputs an error syndrome together with error-corrected (if necessary/possible) message data, the latter constituted by 2*V bits that include the V-bit application data block together with V bits of merged pattern data/metadata. Syndrome comparator 169 evaluates/compares the $2^q$ error syndromes, identifying one of those syndromes as reflecting one fewer symbol errors than the others and outputting a q-bit index corresponding to the RS decoder that sourced that fewest-symbol-error syndrome as the recovered metadata value. As shown, the recovered metadata is supplied to multiplexer/selector circuit 171 to select, as the read-back (and possibly error-corrected) application data block, the V-bit application data block from the RS decoder that sourced the fewest-bad-symbol syndrome. Note that the remaining V bits of metadata-selected RS decoder output may be dropped/ignored as those bits merely constitute locally generated content (the pattern data) and metadata (already recovered). In alternative embodiments in which RS decoder indices do not correspond one-for-one with corresponding metadata values, multiplexer 171 may pass both the application data block and the metadata components (V+q bits) output by the syndrome-identified RS decoder (i.e., in response to the q-bit index output from syndrome comparator 169) to downstream logic.

Still referring to FIG. 1, capabilities and configuration of physical memory (DIMMs in the depicted example) may bear on data-expander/encoder and data-expander/decoder implementations—for example, matching the RS symbol size (k) to the data interface width 't' of an individual DIMM-mounted memory device (or an integer multiple or divisor thereof) to enable application data recovery (and thus ongoing system operation) despite a failed memory device (i.e., where every symbol output from that memory device is bad). In the FIG. 1 embodiment, for instance, the application data block and ECC generated by data expander/ECC encoder 121 are forwarded to I/O circuitry 123 which, in turn, transmits those block components (application data block and ECC) to a selected DIMM via respective data channel and ECC channel components of memory channel 105. By implementing the enlarged RS decoder to have (i) a symbol size m that matches (or is an integer multiple) the memory device width 't' and (ii) an error correction capability ((n−k)/2) that matches or exceeds the total number of symbols written to/read-back from an individual memory device in a given memory access (write or read) transaction, the RS encoding/decoding will enable recovery of data written to a failed memory device (i.e., for which all data output is nominally corrupted/bad). Referring to the I/O circuit embodiment shown in detail view 127, a serializer/deserializer circuit 131 serializes each outgoing application data block data for burst transmission (multiple serial bits per link via output driver circuits 133 (counterpart receivers 135 for read data receipt)) to a number (N) of memory devices over an N*t bit data channel, where the burst length 'b' (number of bit-time intervals per application data block transmission) is set according to the ratio of the application data block size (V) to the data channel width (N*t) so that b=V/N*t. Likewise for the outgoing ECC—serialized for transmission to a number (E) of memory device over and E*t bit ECC channel, again with burst length 'b'. Accordingly, by setting (i) RS symbol size 'm' to match memory device width 't' (and the burst length to the value of t or multiple thereof) so that each memory device will store an integer number (b/t) of symbols per write data transaction (and output that same integer number of symbols per read transaction), and (ii) setting the RS error correction capability (n−k)/2 to meet or exceed b/t (the number of symbols stored per memory device per write transaction—i.e., per application data block), application data blocks written to the subject DIMM may be recovered on data read-back despite systemic failure of a single memory device, thus permitting ongoing memory system operation albeit with greater exposure to random (non-systemic) symbol error.

Device-failure tolerance is achieved in various embodiments of the FIG. 1 memory system by implementing the data-expander/encoder/decoder circuitry in accordance with application data block size (V), memory channel width in bits and number of connected memory devices (N+E) —i.e., implementing the RS encoders/decoders to effect an m-bit symbol size that matches the channel width divided by N+E (and thus the per-memory-device interface width 't') and an error correction capability that meets or exceeds the number of symbols stored in each individual memory device per write data burst (i.e., b/m). As a specific example, in a memory system populated by one or more DIMMs each having two independent 40-bit memory channels (32-bit data channel, 8-bit ECC channel), 16-byte application data block size (so that burst length=4), and either 4-bit or 8-bit memory-device interface widths (e.g., in compliance with the JEDEC DDR5 standard), a distinct/dedicated controller-side signaling interface 115 may be implemented for each data channel with RS encoder/decoder parameters (n'=n+k, k'=2k, m), where m=8, k=16*8/m and n+k=20*8/m. That is, RS (36, 32, 8), with each 16-byte application data block and ECC conveyed to 10×4 memory devices or 5×8 memory devices. ECC encoding/decoding may be implemented with numerous other RS parameters according to characteristics of the subject memory system and error detection/correction objectives.

FIG. 2 illustrates an exemplary syndrome comparator embodiment 180 that may be used to implement syndrome comparator 169 of FIG. 1. As shown, the syndrome comparator includes an error comparator circuit 181 that compares the $2^q$ incoming syndromes (S0 to S($2^q$−1)) and encodes, as the recovered metadata value, an q-bit index corresponding to the syndrome reporting one fewer bad symbols than the others. That index (metadata value) is supplied to multiplexer 183 to select the corresponding syndrome (i.e., reporting one fewer bad symbols than the others) as the finalized syndrome of the RS decoding operation.

FIG. 3 presents an exemplary listing/tabulation of actions implemented by the FIG. 2 syndrome comparator for various syndrome status conditions and corresponding bad-symbol counts. Where the incoming application data block contains no (zero) bad symbols, the syndrome from the RS decoder receiving the correct metadata value (i.e., matching the metadata encoded into the ECC during data write) will report zero bad symbols, while the syndromes from the other RS decoders will each report one bad symbol (as none of the metadata values supplied to those decoders matches the metadata encoded into the ECC during data write). Accordingly, the syndrome comparator outputs the syndrome reporting zero bad symbols together with the corresponding metadata value (e.g., encoding the output metadata as the index of the RS decoder that supplied the zero-error syndrome).

Continuing with FIG. 3, where the application data block contains a correctable number of bad symbols (1 to (n−k)/2 bad symbols), one of the syndromes will report that number of bad symbols, while the others report one additional bad symbol (i.e., 2 to 1+(n−k)/2 bad symbols) due to the incorrect metadata values supplied to their RS decoders. Accordingly, as in the zero-bad-symbol case, the syndrome comparator outputs the syndrome reporting the fewest bad symbols and the corresponding metadata value. As the application data block contained a correctable number of bad symbols, those symbols are corrected in RS decoded application data (i.e., both the finalized application data block and the metadata are error-free/good).

The next two entries in the FIG. 3 table correspond to application data blocks having a detectable but not correctable number of bad symbols—from 1+(n−k)/2 bad symbols to n−k bad symbols, with the n−k case presented separately to emphasize optional/programmable syndrome-comparator behavior. Taking the bad-symbol count greater than (n−k)/2 and less than n−k first, the syndrome comparator behaves as in the first two table rows, outputting the syndrome reporting the fewest bad symbols and corresponding metadata. In this instance, the metadata is confirmed to be correct (good) while the application data block is reported (by the output syndrome) to have between 1+(n−k)/2 and (n−k−1) uncorrected symbols—data is bad. In the n−k bad-symbol case (fourth row of FIG. 3 table), the syndrome from the RS decoder receiving the correct metadata value will report n−k bad symbols, while the syndromes from the other RS decoders will each report a "bogus" value indicating an indefinite number of symbols greater than n−k. In one embodiment the syndrome comparator action in this instance is established by a programmed policy setting (e.g., within a programmable register or other configuration circuit) to interpret the bogus-valued syndromes as reflecting either (i) exactly n−k bad symbols within the application data block plus one bad symbol resulting from invalid metadata (i.e., so that the n−k+1 bad symbols exceeds the bad-symbol reporting threshold), or (ii) an unknown number of symbol errors within the application data block and thus a lack of trust in the syndrome reporting n−k bad symbols. In the first instance (bogus-valued syndromes interpreted as reporting n−k bad symbols in application data block), the syndrome comparator executes the same action as in the prior table rows—outputting the syndrome that reported the fewest bad symbols (n−k) together with the corresponding metadata value. Note that with this action, the overall data-expander/RS decoding exactly the matches the behavior and performance of a conventional RS decoder (i.e., no functionality is compromised). In the second instance (lack of trust in syndrome reporting n−k symbols), the syndrome comparator outputs a bogus-valued syndrome to indicate both the application data block and metadata are bad (outputting, for example, the metadata corresponding to the (n–k)-reporting syndrome). If all the syndromes report bogus values (final line of FIG. 3 table), the syndrome comparator outputs any of those syndromes (e.g., the syndrome sourced by the RS decoder having the lowest index) to indicate that both the application data block and metadata are bad (outputting, for example, the index of the syndrome-sourcing RS decoder as the metadata).

While FIGS. 1-3 have been described with respect to Reed-Solomon encoder/decoder implementations, any practicable block-code encoding/decoding schemes (e.g., other linear block code encoders, other polynomial code encoders) may be used in alternative embodiments. Also, in some embodiments (including embodiments with block-code or polynomial encoder/decoders other than the RS encoders/decoders shown), the input message length after adding combining the metadata bits, application data block and any pattern data may be less than twice the size of the original application data block (i.e., between V+q and 2V−1, inclusive). More generally, the reference to application data block herein refers to data from any practicable source within the host system (e.g., operating-system data, hardware-function-related data, process data, etc.) and the host system itself may be any computing device or other device requiring data storage and retrieval (e.g., smartphone or other handheld computing device or appliance, laptop computer, network appliance, smart television or other home appliance, etc.). Similarly, though DIMM-mounted memory devices and interconnects thereto are depicted in FIG. 1, physical memory may be implemented in any practicable arrangement and form factor (e.g., system-in-package having one or more memory dies, IC-package-based memory module, etc.). Also, while referred to herein as metadata, the ECC-encoded (over-capacity) data may be constituted by any type of data from any source, and while the amount of ECC-encoded data (q) is generally expected to be small (e.g., 2 bits per application data block to support Compute Express Link (CXL) or similarly small number of bits to support other cache-coherent interconnects), q may generally have any practicable value up to the application data block size (V) or up to the message length (ML—the size of the data input at ECC encoder) less the application data block size (V) where data is expanded (at the RS encoder/decoder input) beyond the application data block size. That is, q may have any practicable number satisfying the condition q≤ML−V. Additionally, while RS encoding/decoding operations have been described in terms of individual encoders/decoders that operate on an expanded message size (e.g., twice the application data block size in the FIG. 1-3 embodiments), each RS (n'=n+k, k'=2*k, m) encoder/decoder may be implemented by two or more component encoders/decoders. FIG. 4, for example, illustrates an RS (80, 64, 4) encoder implemented by two component RS (40, 32, 4) encoders, or by four component RS (20, 16, 4) encoders, etc. RS decoders may likewise be implemented by component decoders to achieve a desired decode sequence, including component decoders that operate with respect to staggered input data arrival times as shown, for example, in FIG. 5 (component RS (20, 16, 4) decoders operating on successively responsive portions of application data block, with component syndrome values merged within merge circuitry 201 to yield final per-decoder syndrome. In yet other embodiments, the $2^q$ parallel RS decoders shown in FIG. 1 may be implemented by one or more iteratively cycled RS decoders, each such decoder generating a corrected application data block and syndrome per iteration with respect to per-iteration incremented metadata value. FIG. 6 illustrates such an approach using a single RS decoder to carry out $2^q$ RS decode operations each with respect to the same application data block, ECC value and pattern data (buffering those values as necessary to ensure their availability, 203), and with a counter-incremented q-bit metadata value (q=2 in the depicted example). The syndrome and corrected application data block generated in each RS decode iteration may be buffered as necessary (205) to enable syndrome comparator operation and finalized application data block selection (e.g., as shown in FIG. 2).

Referring to FIGS. 1-6 generally, capacity-expanding memory controllers may be implemented within a stand-alone integrated circuit component or packages or within one or more IC components (including packages having multiple IC dies) that combines the memory control function with one or more other functions (e.g., integrated-circuit processor, application-specific integrated circuit (ASIC), etc.). Also, one or more programmed microcontrollers and/or dedicated hardware circuits (e.g., finite state machines, registered or combinational circuits, etc.) may implement and/or control all or part of the various architectural and functional elements within the memory controller architectures presented herein (e.g., to implement any one or more of the ECC decoders, encoders, pattern data generators, syndrome comparator, etc.). Additionally, any or all of those architectural/functional elements (including the entirety of a over-capacity memory controller architecture according to embodiments herein) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, the various memory device widths, per-DIMM device counts, singling path widths, data block sizes, message lengths, encoding/decoding schemes and parameters, host interface types, data-unit sizes (e.g., nibbles, bytes), error detection/correction capabilities, and so forth are provided for purposes of example only—any practicable alternatives may be implemented in all cases. Similarly, signaling link parameters, protocols, configurations may be implemented in accordance with any practicable open or proprietary standard and any version of such standard. Links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device or register "programming" can include, for example and without limitation, loading a control value into a configuration register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operational aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit component comprising:
encoding circuitry to generate an error correction code corresponding to (i) a first block of data constituted by V bits, (ii) first supplemental data constituted by q bits, and (iii) first pattern data constituted by V minus q bits, where V and q are nonzero integers and V is greater than q;
control circuitry to store the first block of data and the error correction code within one or more external memory components in a memory write transaction, and to retrieve the first block of data and the error correction code from the one or more external memory components in a memory read transaction; and
decoding circuitry to generate a plurality of error syndromes each corresponding to a respective input data volume constituted by (i) the retrieved first block of data, (ii) the first pattern data, and (iii) a q-bit candidate supplemental data value, the candidate supplemental data value within each respective input data volume having one of $2^q$ data patterns that is unique with respect to the candidate supplemental data value within the respective input data volume corresponding to each other of the plurality of error syndromes.

2. The integrated circuit component of claim 1 wherein the control circuitry to store the first block of data and the error correction code within the one or more external memory components in the memory write transaction comprises circuitry to store within the one or more external memory components, as a totality of data stored in the memory write transaction, the V bits of the first block of data and constituent bits of the error correction code.

3. The integrated circuit component of claim 1 wherein the control circuitry to retrieve the first block of data and the error correction code from the one or more external memory components in the memory read transaction comprises circuitry to read out of the one or more external memory components, as a totality of data retrieved in the memory write transaction, the V bits of the first block of data and constituent bits of the error correction code.

4. The integrated circuit component of claim 1 further comprising a syndrome comparator circuit to identify, within the plurality of error syndromes generated by the decoding circuitry, a first error syndrome that reports fewer errors than all others of the plurality of error syndromes.

5. The integrated circuit component of claim 4 wherein the syndrome comparator circuit outputs, as a recovered instance of the first supplemental data, the candidate supplemental data value to which the first error syndrome corresponds.

6. The integrated circuit component of claim 1 wherein the decoding circuitry to generate the plurality of error syndromes comprises circuitry to generate $2^q$ error syndromes each corresponding to a respective one of $2^q$ input data volumes.

7. The integrated circuit component of claim 6 wherein each of the $2^q$ input data volumes differs from each other of the $2^q$ input data volumes only with respect to its constituent candidate supplemental data value.

8. The integrated circuit component of claim 1 wherein the decoding circuitry to generate the plurality of error syndromes comprises circuitry to simultaneously generate at least two error syndromes of the plurality of error syndromes.

9. The integrated circuit component of claim 1 further comprising buffer circuitry to store one or more of the plurality of error syndromes generated by the decoding circuitry while the decoding circuitry generates one or more others of the plurality of error syndromes.

10. The integrated circuit component of claim 1 further comprising circuitry to generate the first pattern data based at least in part on one or more values specific to the memory write transaction.

11. The integrated circuit component of claim 1 further comprising circuitry to generate the first pattern data based at least in part on one or more constituent bits of the first block of data.

12. The integrated circuit component of claim 1 wherein the decoding circuitry to generate the plurality of error syndromes each corresponding to the respective input data volume comprises one or more Reed-Solomon decoder circuits to execute a plurality of Reed-Solomon decoding operations to respectively generate the plurality of error syndromes.

13. A method of operation with an integrated circuit component, the method comprising:
generating an error correction code corresponding to (i) a first block of data constituted by V bits, (ii) first supplemental data constituted by q bits, and (iii) first pattern data constituted by V minus q bits, where V and q are nonzero integers and V is greater than q;

storing the first block of data and the error correction code within one or more external memory components in a memory write transaction;

retrieving the first block of data and the error correction code from the one or more external memory components in a memory read transaction; and generating a plurality of error syndromes each corresponding to a respective input data volume constituted by (i) the retrieved first block of data, (ii) the first pattern data, and (iii) a q-bit candidate supplemental data value, the candidate supplemental data value within each respective input data volume having one of $2^q$ data patterns that is unique with respect to the candidate supplemental data value within the respective input data volume corresponding to each other of the plurality of error syndromes.

14. The method of claim 13 wherein storing the first block of data and the error correction code within the one or more external memory components in the memory write transaction comprises storing within the one or more external memory components, as a totality of data stored in the memory write transaction, the V bits of the first block of data and constituent bits of the error correction code.

15. The method of claim 13 wherein retrieving the first block of data and the error correction code from the one or more external memory components in the memory read transaction comprises reading out of the one or more external memory components, as a totality of data retrieved in the memory write transaction, the V bits of the first block of data and constituent bits of the error correction code.

16. The method of claim 13 further comprising identifying, within the plurality of error syndromes, a first error syndrome that reports fewer errors than all others of the plurality of error syndromes.

17. The method of claim 16 further comprising outputting, as a recovered instance of the first supplemental data, the candidate supplemental data value to which the first error syndrome corresponds.

18. The method of claim 13 wherein generating the plurality of error syndromes comprises generating $2^q$ error syndromes each corresponding to a respective one of $2^q$ input data volumes.

19. The method of claim 13 wherein generating the plurality of error syndromes comprises simultaneously generating at least two error syndromes of the plurality of error syndromes.

20. The method of claim 13 further comprising buffer storing one or more of the plurality of error syndromes while generating one or more others of the plurality of error syndromes.

21. The method of claim 13 further comprising generating the first pattern data based at least in part on one or more constituent bits of the first block of data.

22. The method of claim 13 wherein generating the plurality of error syndromes comprises executing a plurality of Reed-Solomon decoding operations to respectively generate the plurality of error syndromes.

23. An integrated circuit component comprising:

means for generating an error correction code corresponding to (i) a first block of data constituted by V bits, (ii) first supplemental data constituted by q bits, and (iii) first pattern data constituted by V minus q bits, where V and q are nonzero integers and V is greater than q;

means for storing the first block of data and the error correction code within one or more external memory components in a memory write transaction and for retrieving the first block of data and the error correction code from the one or more external memory components in a memory read transaction; and means for generating a plurality of error syndromes each corresponding to a respective input data volume constituted by (i) the retrieved first block of data, (ii) the first pattern data, and (iii) a q-bit candidate supplemental data value, the candidate supplemental data value within each respective input data volume having one of $2^q$ data patterns that is unique with respect to the candidate supplemental data value within the respective input data volume corresponding to each other of the plurality of error syndromes.

* * * * *